(12) United States Patent
Diessel

(10) Patent No.: US 7,666,037 B2
(45) Date of Patent: Feb. 23, 2010

(54) SERIES TERMINAL, TEST PLUG AND TEST TERMINAL BLOCK

(75) Inventor: Thorsten Diessel, Hiddenhausen (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 38 days.

(21) Appl. No.: 11/937,057

(22) Filed: Nov. 8, 2007

(65) Prior Publication Data
US 2008/0106266 A1  May 8, 2008

(30) Foreign Application Priority Data
Nov. 8, 2006  (DE) .................. 10 2006 052 894

(51) Int. Cl.
    *H01R 11/22* (2006.01)
(52) U.S. Cl. .................. 439/857; 439/94; 439/716
(58) Field of Classification Search .............. 439/857, 439/94, 532, 716, 721, 834, 835
    See application file for complete search history.

(56) References Cited

U.S. PATENT DOCUMENTS

| 3,289,146 | A | | 11/1966 | Tuchel |
| 4,773,867 | A | * | 9/1988 | Keller et al. .................. 439/49 |
| 5,546,267 | A | | 8/1996 | Frederiksen et al. |
| 7,271,357 | B2 | * | 9/2007 | Ostmeier .................. 200/51.09 |

FOREIGN PATENT DOCUMENTS

| DE | 70 25 172 U | 8/1971 |
| DE | 74 14 444 U | 4/1975 |
| DE | 10 2005 025 108 B3 | 7/2006 |
| EP | 0 456 987 A1 | 11/1991 |
| EP | 0 645 841 A1 | 3/1995 |
| EP | 1 246 303 A1 | 10/2002 |
| FR | 2 165 70 | 8/1973 |
| GB | 2 013 423 A | 8/1979 |

OTHER PUBLICATIONS

European Search Report of Application No. EP 07 02 1270, Oct. 22, 2008.

* cited by examiner

*Primary Examiner*—Tho D Ta
*Assistant Examiner*—Travis Chambers
(74) *Attorney, Agent, or Firm*—David S. Safran; Roberts Mlotkowski Safran & Cole, P.C.

(57) ABSTRACT

An electrical series terminal with a terminal housing, with two conductor connecting elements located in it, and with two current busses, first end regions of which are each assigned to a conductor connecting element and second end regions of which together form an elastic contact region for accommodating the contact plug of a test plug. In the electrical series terminal, when the test plug is inserted into the test opening, elastic contact legs of the second end regions are bent back relative to one another and which together form a second elastic contact region for holding the contact plug of a test plug. The second contact region in the insertion direction is located in front of the first contact region so that an inserted contact plug first makes contact with the second contact region and only upon further insertion with the first contact region.

16 Claims, 6 Drawing Sheets

SERIES TERMINAL, TEST PLUG AND TEST TERMINAL BLOCK

BACKGROUND OF THE INVENTION

1. Field of Invention

The invention relates to an electrical series terminal, with a terminal housing, with at least two conductor connecting elements located in it, and with at least two current busses, the first end regions of which are each assigned to a conductor connecting element and the second end regions of which together form an elastic contact region for accommodating the contact plug of a test plug, the second end regions in the uninserted state of the contact plug making contact in the contact region so that the two conductor connecting elements are electrically connected to one another via the two current busses.

In addition, the invention relates to a test plug for insertion into an electrical series terminal, with an insulating housing and a contact plug, the contact plug having two terminal contacts which are arranged in succession in the lengthwise direction of the test plug and which are separated from one another by an insulating crosspiece. Finally, the invention also relates to a test terminal block comprised of a host of series terminals located next to one another and of a plurality of test plugs.

2. Description of Related Art

Electrical series terminals have been known for decades and have been used millions of times in the wiring of electrical systems and devices. The terminals are generally locked onto support rails which, for their part, are often located in a control cabinet. The conductor connecting elements in series terminals are mainly screw terminals or tension spring terminals. The clamping principle for tension spring terminals is similar to that of screw technology. While in the screw terminal a tension sleeve pulls the lead against the current bus by the actuation of the terminal screw, in the tension spring terminal this task is assumed by the tension spring. In addition, however, also insulation-piercing connecting devices or leg spring terminals can be used.

Moreover, electrical series terminals can be distinguished according to the number of conductor connecting elements. The basic type of series terminal has two conductor connecting elements which are connected to one another via a current bus; in addition however there are also series terminals with three, four or more conductor connecting elements. These series terminals, depending on their construction, are called three-lead or four-lead terminals and two-tier or three-tier terminals.

Electrical terminals are generally connecting terminals so that they have at least two conductor connecting elements which are electrically connected to one another via an electrically conductive connecting bar, the current bus. In addition to this basic type of series terminal which is often also called a feed-through terminal, there are numerous different series terminal types which are specially matched to the respective applications (see, Phoenix Contact Katalog Series terminals CLIPLINE 2005, pages 4-10). Examples are protective-conductor terminals, isolating blade terminals, and installation terminals.

In switching, measurement and control engineering, feed-through terminals with a separation possibility are the standard. The separation possibility implemented in the electrical series terminal, i.e., the separation site provided in the current bus, makes it possible to insert different plugs with different functions into the terminal housing of the series terminal which then make contact with the current bus at the separation site. In addition to simple disconnect plugs or feed-through connectors, the plugs can also be especially test plugs which can have special components and which enable checking of proper operation of the circuit connected to the series terminal.

Since the electrical series terminals are generally made disk-shaped, they are generally mated with several other electrical series terminals to form a terminal block. Then, a number of test plugs which corresponds to the number of series terminals can be inserted into such a terminal block.

A device is disclosed by German Patent Application 10 2005 025 108 B3 for testing a protective, measurement or counting means, for example, a network short relay of a high voltage or medium voltage system which has a pole strip which can be connected to the electrical means with several successively arranged pole openings and a plug block with a number of pole tongues which corresponds to the number of pole openings. An individual pole strip module of the pole strip consists of a housing in which two jacks for connection to the system and spring-loaded contact clips which are connected to the jacks are located. The two contact clips can make contact with the pole tongue of the plug, the pole tongue of the plug having two pole crosspieces which are separated from one another by an insulating crosspiece. The insulating crosspiece together with the corresponding pole opening in the pole strip module produce polarization which ensures that only one plug with a certain pole tongue can be inserted into a certain pole opening of a pole strip.

In the uninserted state of the plug or the pole tongue into the pole strip, the two contact clips make contact with one another so that the two jacks are connected to one another in an electrically conductive manner and a current can flow via a connected pole strip. If, conversely, the plug is completely inserted into the pole opening with its pole tongue, the two contact strips are electrically separated from one another and the current flow is routed via the plug, so that a test process can be carried out. In an intermediate stage—when the pole tongue of the plug is inserted into the pole opening—the two pole crosspieces make electrical contact with the two contact strips without the two contact strips already being separated from one another. However, the current flowing via the plug, in this case, is strongly dependent on how exactly the pole tongue of the plug is inserted into the pole opening of the pole strips, and slight tilting of the plug can lead to the two contact strips not making contact with the two pole crosspieces of the pole tongue at the same time.

SUMMARY OF THE INVENTION

A primary object of this invention is to improve the initially described electrical series terminal so as to ensure reliable and defined contact states when a test plug is inserted into the test opening. It is a related object of the invention is to provide the initially described test plug which with a simple structure that enables increased flexibility when testing switchgear and measuring instruments.

The first object is achieved in the electrical series terminal in accordance with the invention in that the second end regions of the two current busses have elastic contact legs which are bent back relative to one another and which together form a second elastic contact region for holding the contact plug of a test plug, the contact legs of the second contact region, being out of contact with each other in the uninserted state of the contact plug, so that the second contact region is open, and the second contact region in the insertion direction of the contact plug being located in front of the first contact region, so that an inserted contact plug first makes contact with the second contact region, and only upon further insertion makes contact with the first contact region.

Executing a defined second contact region which is located in the insertion direction of the contact plug in front of the first contact region ensures that when the contact plug is inserted through the test opening in the terminal housing of the electrical series terminal, a secure electric connection is first formed between the contact plug and the two current busses before the first contact region is opened as the contact plug continues to be inserted, i.e., the two current busses are electrically separated from one another.

In accordance with the invention, both the first contact region and also the second contact region are made as elastic contact regions, by which the required contact force can be easily set. While the first contact region is made as a break contact, the second contact region corresponds to a make contact, i.e., in the uninserted state of the test plug the two contact legs of the second contact region are separated from one another.

According to a preferred embodiment, the second contact region is especially easily implemented by the contact legs of the second end regions of the two current busses being bent back essentially in a V-shape. In this way, the distance between the two contact legs can be easily set to the width of the contact plug of a test plug so that, upon insertion of the contact plug, reliable electrical contact occurs between the contact plug and the two contact legs. Moreover, this configuration of the contact legs of the second end regions ensures that the distance between the two contact legs is reduced in the insertion direction of the contact plug, so that the two contact legs form a type of insertion funnel for the contact plug. To further facilitate the insertion of the contact plug into the electrical series terminal, it is preferably provided that the free ends of the contact legs of the second end regions are rounded or are bent to outward. In this way, tilting of the tip of the contact plug on the free ends of the contact legs upon insertion is reliably prevented.

According to another advantageous embodiment of the electrical series terminal, each of the second end regions of the two current busses are supported on inside terminal housing wall between the first contact region and the second contact region. This prevents unintentional opening of the first contact region upon insertion of the contact plug into the second contact region as a result of the elastic property of the second end regions. Because the second end regions of the two current busses are each supported on the inside housing wall in the area of the second contact region, the deflection of the second end regions is limited to the bent-back elastic contact legs.

Implementation of the two current busses with the two end regions can take place by punching out and subsequently bending down an elongated metal strip. However, preferably, it is provided that the two current busses each are formed of two individual elongated metal strips which are electrically conductively connected to one another, especially are welded or soldered to one another. The first end region of a current bus is formed by the first metal strip and the second end region of the current bus is formed by the second metal strip. On the one hand, this simplifies the production of the two current busses, and on the other hand, it makes it possible to use different optimized materials or different optimized cross sections for the two end regions which are made according to the stiffness and spring property which are required by the respective end region.

In a test plug of the initially described type, the aforementioned object is achieved by the invention in that the first terminal contact is connected in an electrically conductive manner to the conductor connecting element via a first current bus section, that the second terminal contact is connected to the second current bus section which has at least two openings, and that there are at least two jumper shafts in the insulating housing for insertion of at least two plug-in jumpers corresponding to the openings in the second current bus section. By making at least two openings in the second current bus section, there is increased variability in bridging of several test plugs so that different test and checking processes can be carried out.

Since the test plug of the invention is often connected together with other test plugs to form a common test plug block, or several test plugs are inserted individually into several electrical series terminals which are located next to one another, it is important that sufficient insulation is ensured between adjacent test plugs, especially between the individual contact plugs. According to a preferred embodiment of the test plug of the invention, this is easily implemented by the insulating housing having at least one insulating section which, viewed in the lengthwise direction of the test plug, runs parallel to the contact plug and has essentially the same length as the contact plug. If all the test plugs which are located next to one another have such an insulating section, it is sufficient if each test plug has only one insulating section. In this way an especially narrow structure of the test plug can be achieved.

For reliable fixing or attachment of the test plug to an electrical series terminal, the insulating housing preferably has at least one catch pin which can lock into a correspondingly made catch recess in the terminal housing of the electrical series terminal and which thus ensures a reliable mechanical connection between the test plug and the series terminal. Moreover, a polarizing element can also be formed on the insulating housing of the test plug which, together with a corresponding counter-polarizing element on the terminal housing of the series terminal, prevents plugging of the "wrong" test plug into a certain series terminal. The polarizing element can, preferably, be made as a polarizing crosspiece or polarizing pin which can be inserted into a corresponding polarizing groove in the series terminal housing.

Electrical series terminals which are generally made diskshaped are often mated to several other electrical series terminals to form a terminal block and are locked onto a support rail. Accordingly, the individual test plugs which in their width generally correspond to the width of the series terminals are connected to form a test plug block and are placed jointly on a corresponding terminal block. In this connection, there is the requirement that the number of series terminals connected to one another and the number of test plugs combined with one another into a test plug block can be freely selected. At the same time however, the test plugs combined into a test plug block should be actuated jointly as simply as possible, i.e., are able to be plugged jointly onto the terminal block.

This feature is achieved in a test terminal block formed of a plurality of series terminals located next to one another and a plurality of test plugs which can be plugged onto the individual series terminals in that, on the two sides of the plurality of series terminals which are located next to one another by a respective mounting terminal, which has a terminal housing with at least one fastening device, and in that, on both sides of the plurality of test plugs which are located next to one another, there is a respective fastening element that has a fastening means which corresponds to the fastening device of the mounting terminals, so that the plurality of test plugs can be mechanically connected via the fastening element to the mounting terminals, and thus, also to the series terminals themselves.

By using two mounting terminals and two fastening elements which are each located on the two sides of the terminal block or of the test plug block, the number of series terminals and the number of test plugs which can be combined into a terminal block or a test plug block can be freely selected.

According to a preferred configuration, the two fastening elements each have a guide crosspiece as the fastening means and the two mounting terminals each have a corresponding guide groove as the fastening device. It is important in this connection that, by the execution of the guide crosspiece and the corresponding guide groove, vertical insertion of the contact plug of the test plug between the two current busses of the electrical series terminal, i.e., into the contact regions of the series terminals, is ensured, and thus, the contact plugs cannot be damaged and tilting cannot occur upon insertion. For this purpose, it is provided that the guide crosspieces of the fastening elements are longer than the contact plugs of the test plugs so that, first of all, the ends of the guide crosspieces dip into the guide grooves before the ends of the contact plugs are inserted into the openings in the series terminals and come into contact with the current busses.

Besides for guidance of the contact plugs upon insertion of the test plugs into the series terminals, the fastening elements can also be used for polarization or for mechanical fastening of the test plug block on the terminal block, for which the fastening elements have the corresponding polarization elements or catch elements and the corresponding polarization grooves or catch grooves are made in the mounting terminals.

According to another preferred configuration which will be only briefly mentioned here, the two fastening elements are connected to one another via a grip piece so that the test plug block together with the two fastening elements can be easily and conveniently inserted into the terminal block and the two mounting terminals using a grip piece. The grip piece is preferably located on the top end of the fastening elements, the fastening elements having a larger cavity than the test plugs so that the grip piece spans the test plugs which are located between the two fastening elements.

Both the individual series terminals and also the individual test plugs can preferably be mechanically connected among one another, for which the corresponding catch pins and catch recesses are made in the terminal housings or in the insulating housings. In addition, the two fastening elements can be mechanically connected to the test plugs and the two mounting terminals can be mechanically connected to the series terminals, for which likewise the corresponding catch pins and catch recesses are made on the fastening elements and in the side wall of the insulating housing of the test plugs or on the mounting terminals and in the side wall of the series terminal housing.

In particular, at this point, there are a host of possibilities for embodying and developing the electrical series terminal, the test plug and the test terminal block in accordance with the invention. In this respect, reference is made to the following description of a preferred embodiment in conjunction with the accompanying drawings.

DETAILED DESCRIPTION OF THE INVENTION

Figure 1:
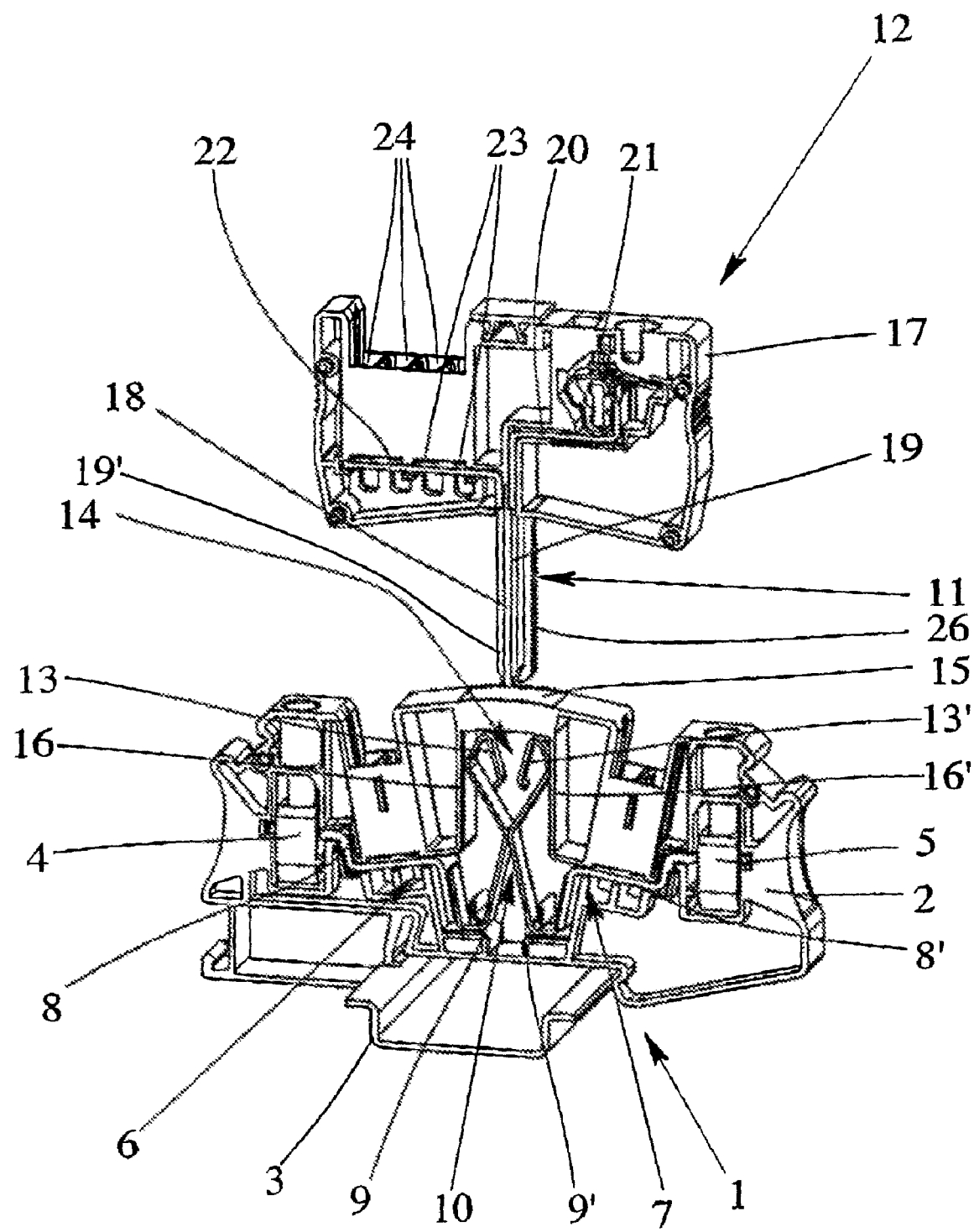
FIG. 1 shows a series terminal in accordance with the invention and a test plug in accordance with the invention, in the not yet inserted state.
Figure 2:
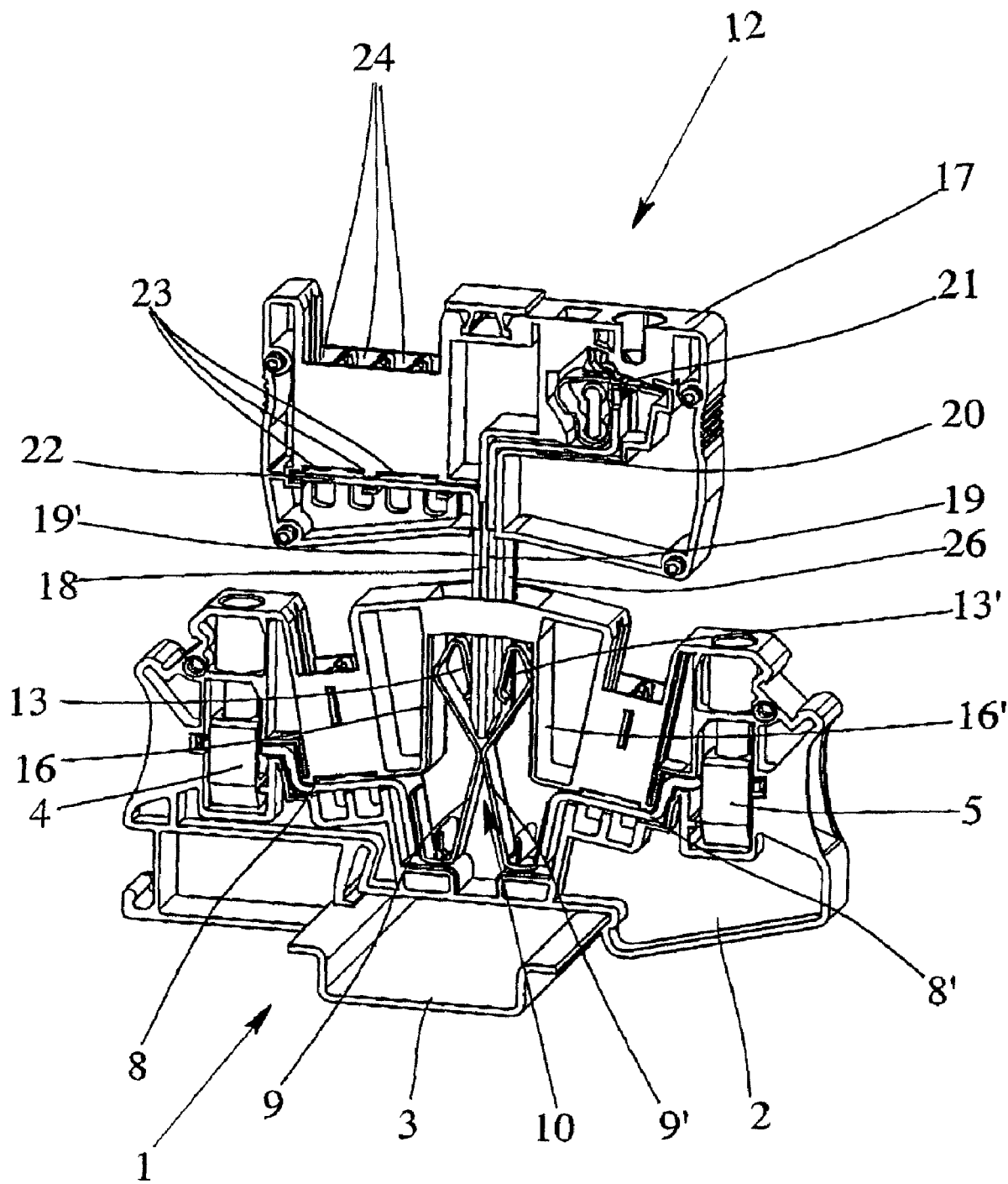
FIG. 2 shows the series terminal as shown in FIG. 1, with the test plug partially inserted.
Figure 3:
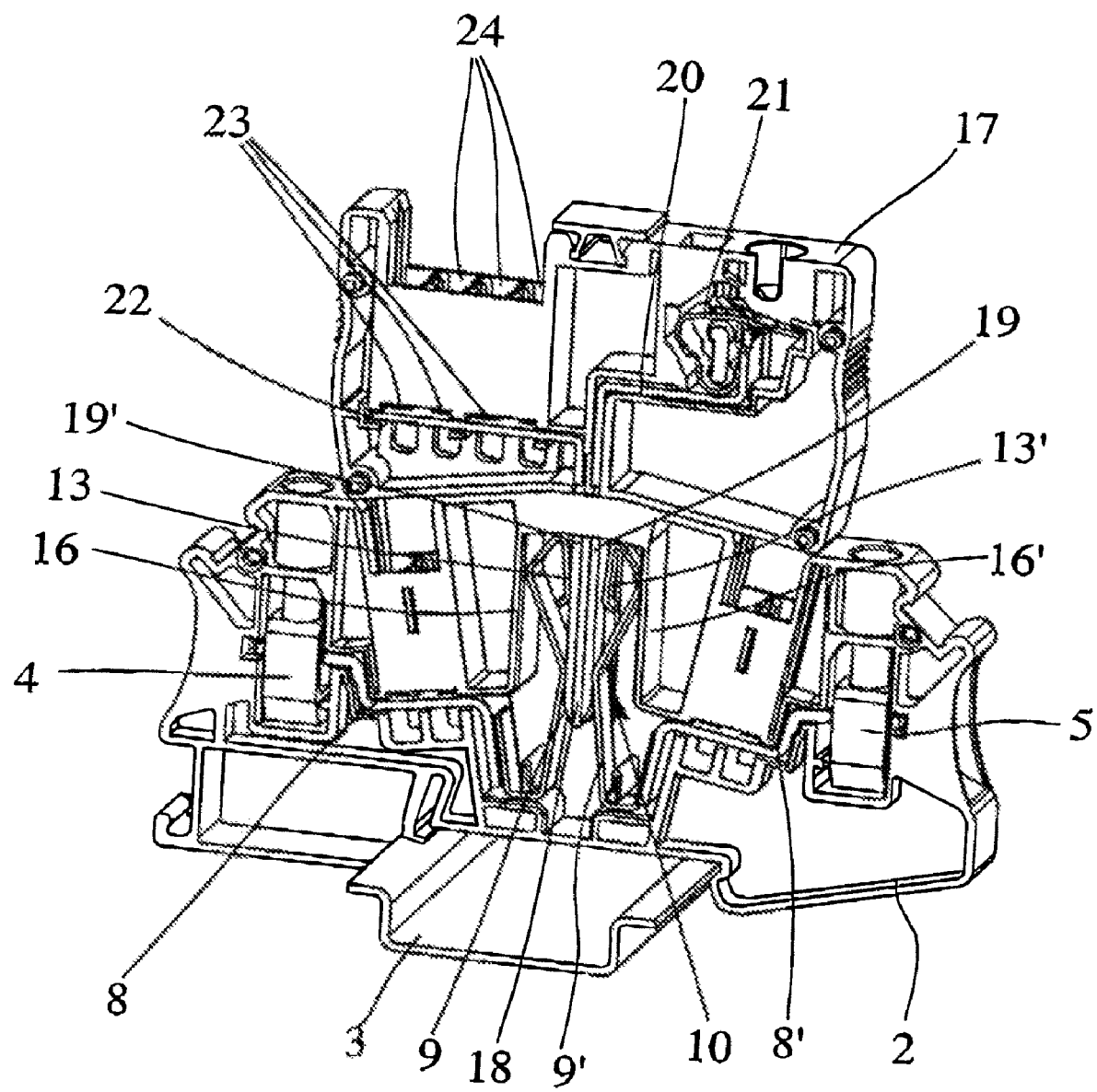
FIG. 3 shows the series terminal as shown in FIG. 1, with the test plug completely inserted.

FIGS. 1 to 3 each show an electrical series terminal 1 and a test plug 12 at a time that the test plug 12 has not yet been inserted state in FIG. 1, in a partially inserted state in FIG. 2, and in the completely inserted state in FIG. 3.

The electrical series terminal 1 has a terminal housing 2 which, in the illustrated embodiment, is locked onto a support rail 3. Within the terminal housing 2 there are two conductor connecting elements 4, 5, the illustrated conductor connecting elements 4, 5 being screw terminals. However, equally well, tension spring terminals, insulation-piercing connecting devices or leg spring terminals can also be used. In addition to the conductor connecting elements 4, 5, there are two identically made current busses 6, 7 in the terminal housing 2. The first end region 8, 8' of the two current busses 6, 7 is respectively assigned to a respective one of the two conductor connecting elements 4, 5, i.e., inserted into the screw terminals, while the two second end regions 9, 9' together form a first elastic contact region 10 for holding the contact plug 11 of the test plug 12.

The first contact region 10 formed by the second end regions 9, 9' of the two current busses 6, 7 is therefore made such that the two second end regions 9, 9' mutually contact one another when the contact plug 11 has not yet been inserted in the electrical series terminal 1. In the state of the test plug 12 shown in FIG. 1, the two conductor connecting elements 4, 5 are thus electrically connected to one another via the two current busses 6, 7, i.e., the first contact region 10 is closed.

The second end regions 9, 9' of the two current busses 6, 7, moreover, each have a bent-back elastic contact leg 13, 13', the two contact legs 13, 13' together forming a second elastic contact region 14 for holding the contact plug 11 of the test plug 12. As is apparent from FIG. 1, the contact legs 13, 13' are arranged and bent such that they do not touch each other in the uninserted state of the contact plug 11, so that the second contact region 14 is open, in contrast to the first contact region 10.

Since the second contact region 14 is located in front of the first contact region 10 in the insertion direction of the contact plug 11, when the contact plug 11 is inserted, contact is first made with the second contact region 14 (FIG. 2) and only upon further insertion is contact made with the first contact region 10 (FIG. 3). In this connection, it is apparent from FIGS. 1 to 3 that an opening 15 is formed in the top of the terminal housing 2 for the contact plug 11 which is arranged symmetrically relative to the first contact region 10 and to the second contact region 14. Otherwise, it is also apparent that the second contact region 14 and the first contact region 10 are arranged flush with one another.

In particular, it is apparent from FIG. 1 that the contact legs 13, 13' of the second end regions 9, 9' are bent back so that, together, they essentially for a V-shape, and that the free ends of the contact legs 13, 13' are bent outward. This yields a type of insertion funnel for the contact plugs 11 which are to be inserted, by which insertion is facilitated. To ensure that when the contact plug 11 is inserted into the second contact region 14 only the contact legs 13, 13' and not the entire second end region 9, 9' of the current busses 6, 7 is deflected, the second end regions 9, 9' are supported, between the first contact region 10 and the second contact region 14, on a respective inside housing wall 16, 16' of the terminal housing 2. The section of the second end regions 9, 9' which is supported on the inside housing walls 16, 16' thus forms the start of the contact legs 13, 13' which have been bent back in a V-shape. This prevents opening of the first contact region 10 when the contact plug 11 is inserted into the second contact region 14. Altogether the second end regions 9, 9' of the two current busses 6, 7, together, are roughly X-shaped, the two contact legs 13, 13' bent back in a V-shaped adjoining the upper end.

In the embodiment of the electrical series terminal 1 which is shown in the figures, the two current busses 6, 7 each are formed of two individual elongated metal strips which are welded or soldered to one another in the transition region. The first two end regions 8, 8' are each formed by a first metal strip and the two second end regions 9, 9' are each formed by a second metal strip. By using different materials for the two metal strips and especially because the two metal strips have different cross sections, the first end region 8, 8' and the second end region 9, 9' can be made especially easily with different spring properties so that the first end region 8, 8' and the second end region 9, 9' can each be dimensioned according to its respective requirements.

The test plug 12 shown in the figures has an insulating housing 17 from which the contact plug 11 projects on one side. The contact plug 11 has two terminal contacts 19, 19' which are separated from one another by an insulating centerpiece 18 and which are located in succession in the lengthwise direction of the test plug 12 (right-to-left direction in FIGS. 1-3). In this way, separation of the first contact region 10 when the contact plug 11 has been completely inserted and thus interruption of the conductive connection between the two conductor connecting elements 4, 5 are possible.

The first terminal contact 19 of the contact plug 11 is connected electrically conductively via a first current bus section 20 to one conductor connecting element 21, in this case to a tension spring terminal, while the second terminal contact 19' is connected to a second current bus section 22 which has altogether four openings 23. Corresponding to the openings 23, in the insulating housing 17 there are four jumper shafts 24 for insertion of a total of four plug-in jumpers 25. As is apparent from the figures, both the first terminal contact 19 and the first current bus section 20 and also the second terminal contact 19' and the second current bus section 22 are each made in one piece.

Moreover, it can be seen in FIGS. 1 to 3 that the insulating housing 17 has an insulating section 26. The insulating section 26, viewed in the lengthwise direction of the test plug 12, runs parallel to the contact plug 11 and has essentially the same length as the contact plug 11. The insulating section 26 is used here to ensure sufficient insulation between pairs of contact plugs 11 of pairs of test plugs 12 which are located adjacent to one another.

Figure 4:
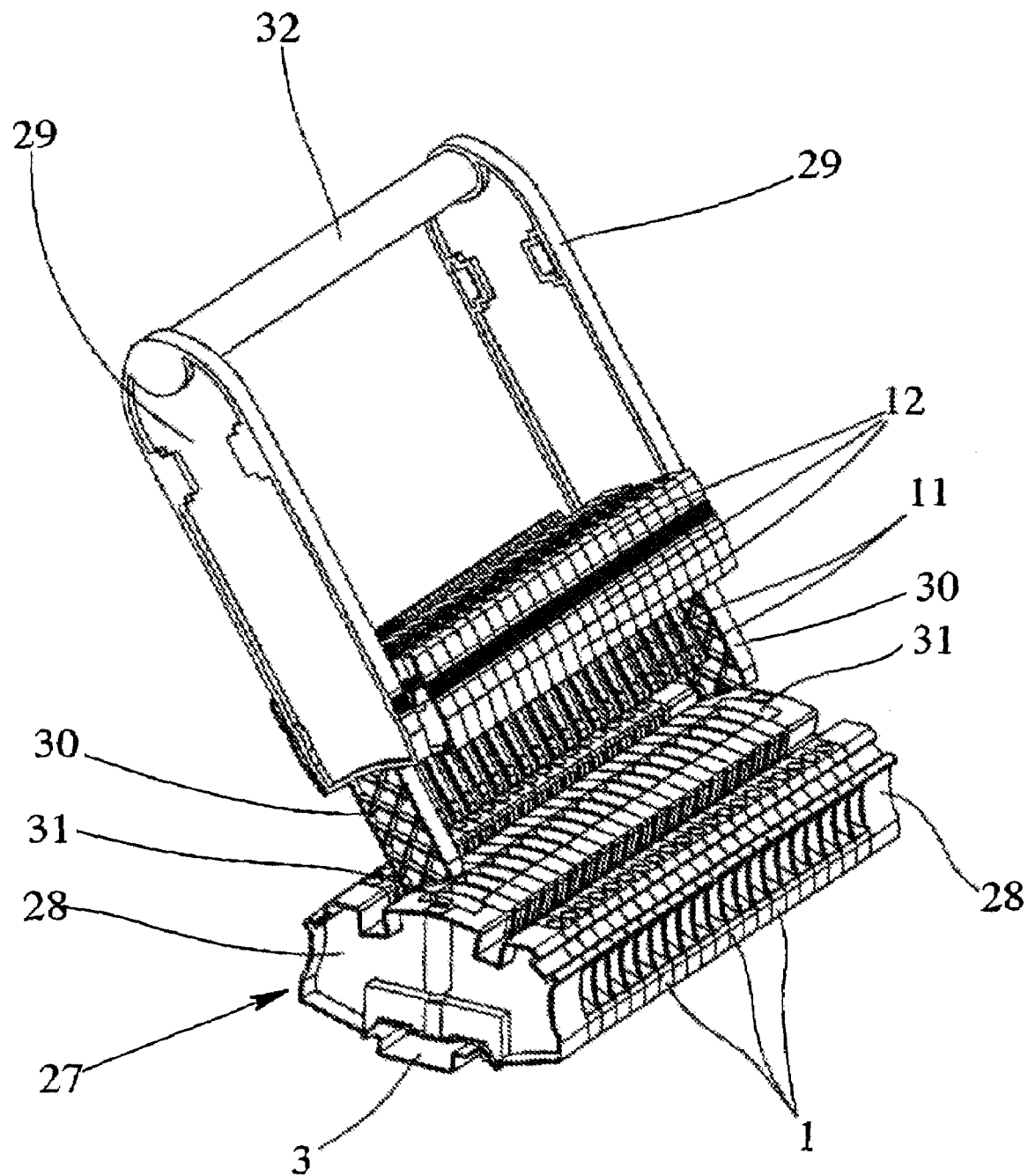
FIG. 4 shows the test terminal block in accordance with the invention, with a plurality of series terminals, two mounting terminals, a plurality of test plugs and two mounting elements, in the not yet inserted state of the test plug.
Figure 5:
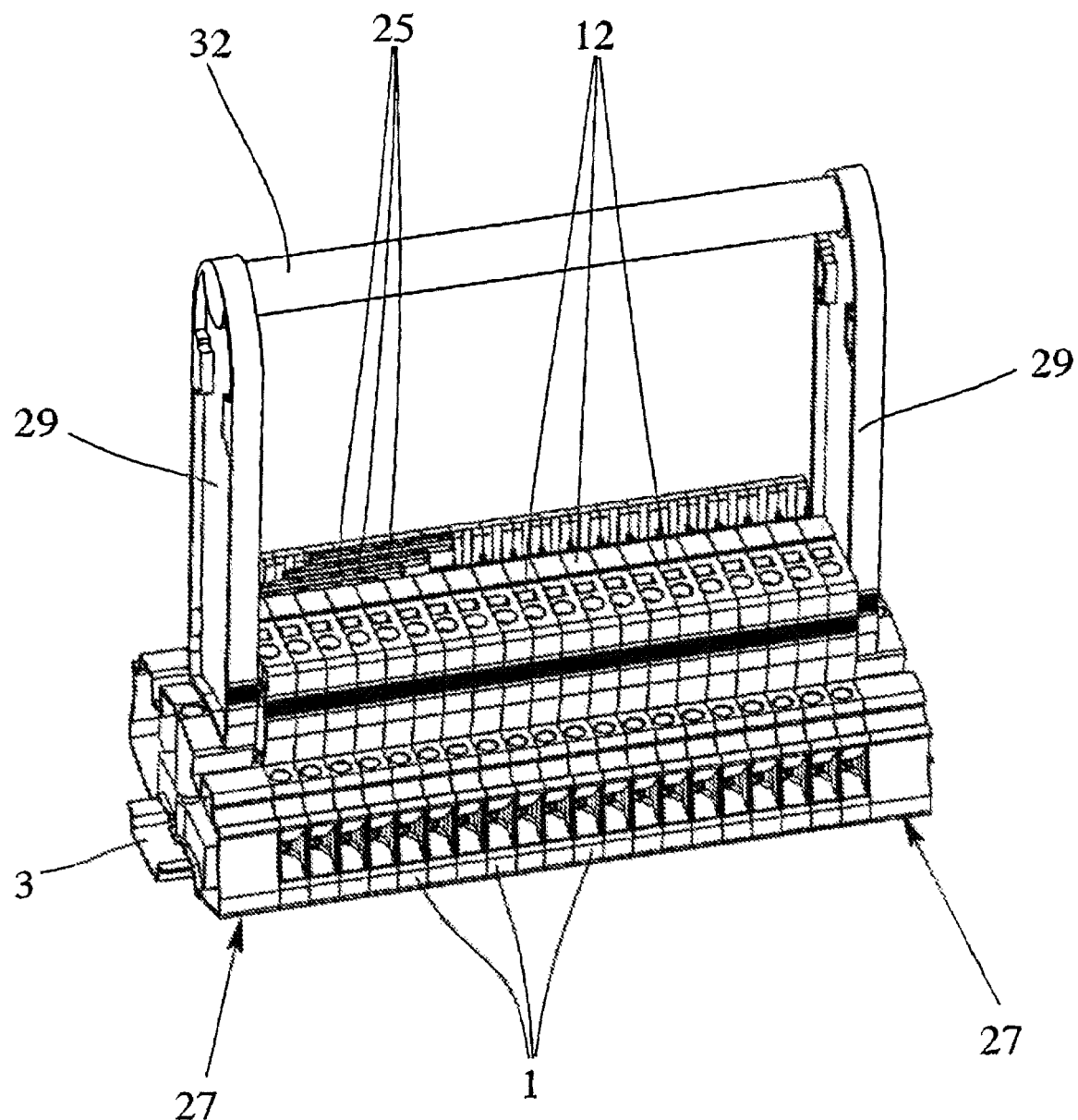
FIG. 5 shows the test terminal block as shown in FIG. 4, in the completely inserted state of the test plug.
Figure 6:
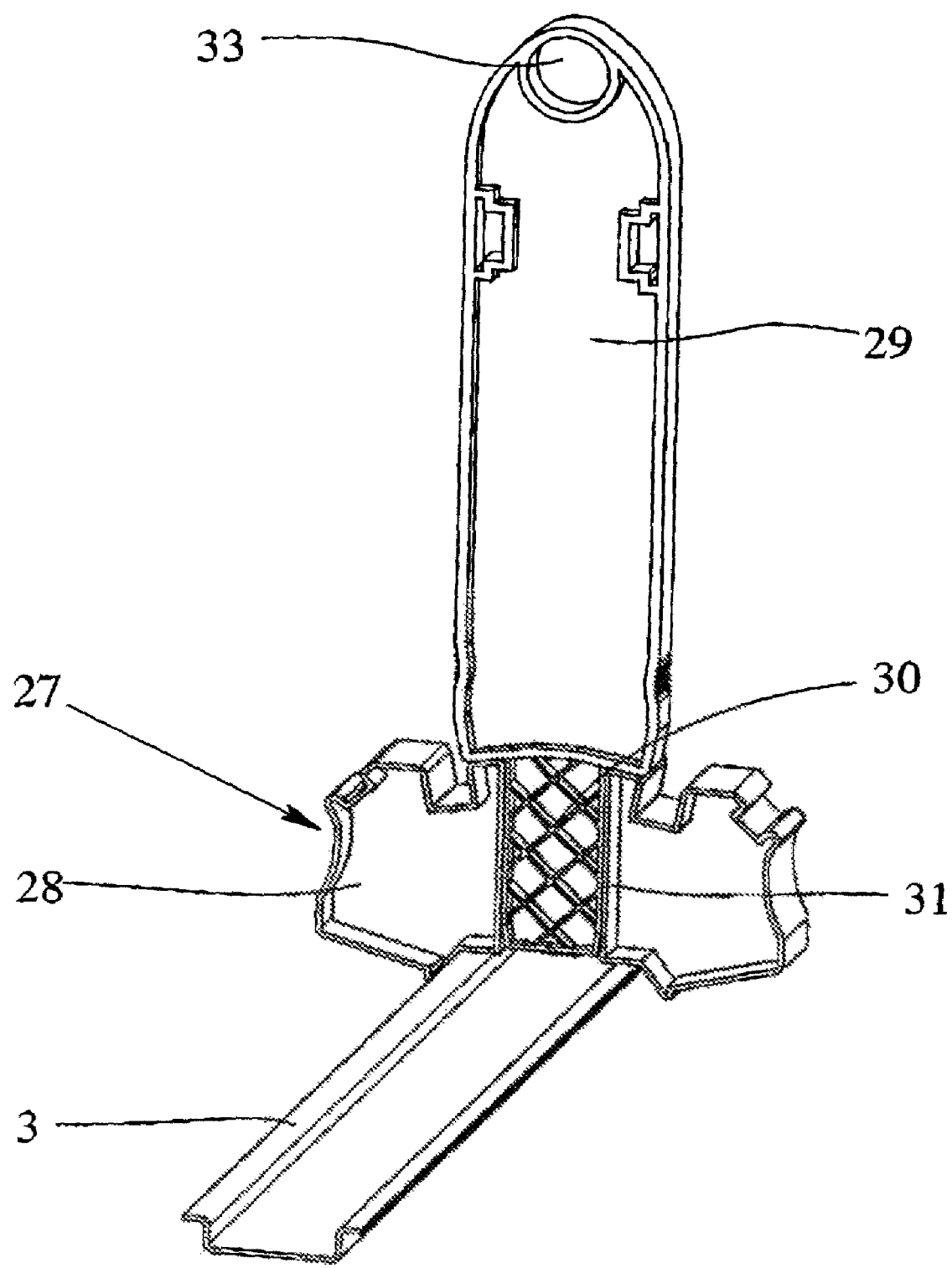
FIG. 6 shows a mounting terminal and a fastening element of a test terminal block as shown in FIGS. 4 and 5.

FIGS. 4 & 5 show a test terminal block formed of a plurality of series terminals 1 which have been connected to one another to form a terminal block and a corresponding number of test plugs 12 which have been mated to form a test plug block. FIG. 4 shows the test plug block in the not yet inserted state, while FIG. 5 shows the individual test plugs 12 plugged into the individual series terminals 1. On both sides of the plurality of terminal blocks, there is a respective mounting terminal 27 which has a terminal housing 28 with a fastening device. Likewise, on both sides of the test plug block, there is a respective fastening element 29 which has a fastening means which corresponds to the fastening device.

In the illustrated embodiment, the two fastening elements 29 each have a guide crosspiece 30 which can be inserted into a guide groove 31 which is made in the terminal housing 28 of the two fastening terminals 27. Here, it is apparent that the guide crosspieces 30 of the fastening elements 29 are longer than the contact plugs 11 of the test plugs 12, by which it is ensured that first the ends of the guide crosspieces 30 dip into the guide grooves 31 before the ends of the contact plugs 11 are inserted into the openings 15 in the series terminals 1. In this way, vertical insertion of the contact plugs 11 between the current busses 6, 7 of the individual series terminals 1 is ensured so that the relatively thin contact plugs 11 cannot be damaged or tilting cannot take place upon insertion.

For simple handling of the test plug block composed of the individual test plugs 12, the two fastening elements 29 are connected to one another via a grip piece 32, the grip piece 32 with its two ends fitting into the corresponding openings 33 on the top end of the fastening elements 29. Because the fastening elements 29 are more than twice as tall as the test plugs 12, actuation of the test plugs 12, especially inserting or pulling the plug-in jumpers 25 by the grip piece 32 which spans the test plugs 12, is not prevented.

In contrast to the execution of the individual test plugs 12 as shown in FIG. 4—in which the contact plugs 11 of all test plugs 12 have the same length—the individual, adjacent test plugs 12 can also have contact plugs 11 of differing length. The test plug 12 is plugged onto the electrical series terminals 1 in the following steps;

insertion of the guide crosspieces 30 of the fastening elements 29 into the guide grooves 31 which are made in the mounting terminals 27.

dipping of the longer contact plugs 11 of individual test plugs 12 into the openings 15 in the terminal housing 2 to make contact with the second contact region 14, the two terminal contacts 19, 19' each making contact with one of the two contact elements 13', 13 in an electrically conductive manner.

opening of the first contact region 10 by the longer contact plugs 11, by which the electrically conductive connection of the two conductor connecting elements 4, 5 is interrupted via the two current busses 6, 7.

dipping of the shorter contact plugs 11 of individual contact plugs 12 into the openings 15 in the terminal housing 2 and contact with the second contact region 14.

opening of the first contact region 10 by the shorter contact plugs 11, by which the electrically conductive connection of the two conductor connecting elements 4, 5 is interrupted.

Of course, it is also possible for the individual contact plugs 11 of the test plugs 12 to have more than two different lengths so that, for example, especially short contact plugs 11, even in the completely inserted state of the test plug block, make contact only with the second contact region 14, but not the first contact region 10.

What is claimed is:

1. Electrical series terminal, comprising:
    a terminal housing,
    at least two conductor connecting elements located in the terminal housing, and
    at least two current busses having first end regions assigned to a respective conductor connecting element and the second end regions which together form an elastic contact region for accommodating a contact plug of a test plug, the second end regions in an uninserted state of the contact plug making contact in a contact region so that a pair conductor connecting elements are electrically connected to one another via the current busses,
wherein the second end regions of the at least two current busses have elastic contact legs which are bent back relative to one another and which together to form a second elastic contact region for holding the contact plug of a test plug,
wherein the contact legs of the second contact region in the uninserted state of the contact plug do not touch each other so that the second contact region is open, and
wherein the second contact region in an insertion direction of the contact plug of a test plug is located in front of the first contact region so that an inserted contact plug first makes contact with the second contact region and only upon further insertion makes contact with the first contact region.

2. Electrical series terminal in accordance with claim 1, wherein the contact legs of the second end regions of the current busses are bent back so as to essentially form a V-shape.

3. Electrical series terminal in accordance with claim 2, wherein free ends of the contact legs of the second end regions are rounded or bent outward.

4. Electrical series terminal in accordance with claim 2, wherein the second end regions of the current busses are supported on a respective inside wall of the terminal housing at a location between the first contact region and the second contact region.

5. Electrical series terminal in accordance with claim 1, wherein each of the current busses are formed of two individual elongated metal strips which are connected to one another in an electrically conductive manner, the two first end regions being formed by the first metal strip and the two second end regions being formed by the second metal strip.

6. Electrical series terminal in accordance with claim 5, wherein the two metal strips of the current busses are made of different materials with different stiffness and spring properties.

7. Electrical series terminal in accordance with claim 5, wherein the two metal strips of the current busses each have a different cross section.

8. Test terminal block comprised of a plurality of series terminals located next to one another in accordance and a plurality of test plugs, the individual test plugs being pluggable onto the individual series terminals,
wherein on two sides of the plurality of series terminals there is a respective mounting terminal which has a terminal housing with at least one fastening device, and
wherein on both sides of the plurality of test plugs there is a respective fastening element which has a fastening means which corresponds to the fastening device so that the plurality of test plugs are mechanically connected via the fastening element to the mounting terminals;
wherein each of the electrical series terminals, comprises:
a terminal housing,
at least two conductor connecting elements located in the terminal housing, and
at least two current busses having first end regions assigned to a respective conductor connecting element and the second end regions which together form an elastic contact region for accommodating a contact plug of a test plug, the second end regions in an uninserted state of the contact plug making contact in a contact region so that a pair conductor connecting elements are electrically connected to one another via the current busses,
wherein the second end regions of the at least two current busses have elastic contact legs which are bent back relative to one another and which together to form a second elastic contact region for holding the contact plug of a test plug,
wherein the contact legs of the second contact region in the uninserted state of the contact plug do not touch each other so that the second contact region is open, and
wherein the second contact region in an insertion direction of the contact plug of a test plug is located in front of the first contact region so that an inserted contact plug first makes contact with the second contact region and only upon further insertion makes contact with the first contact region; and
wherein each of the test plugs, comprises:
an insulating housing and
a contact plug, the contact plug having two terminal contacts which are arranged in succession in a lengthwise direction of the test plug and which are separated from one another by an insulating piece,
wherein a first of the terminal contacts is connected in an electrical conductive manner to a conductor connecting element via a first current bus section,
wherein a second terminal contact is connected to a second current bus section which has at least two openings, and
wherein there are at least two jumper shafts in the insulating housing for insertion of at least two plug-in jumpers corresponding to said two openings.

9. Test terminal block in accordance with claim 8, wherein the two fastening elements are mechanically connectable to the test plugs by means of catch pins located on the fastening elements and catch recesses which are made in the side wall of the insulating housing of the test plugs.

10. Test terminal block in accordance with claim 8, wherein the mounting terminals are mechanically connectable to the series terminals by means of catch pins or catch recesses located on the mounting terminals and catch recesses or catch pins made in the side wall of the terminal housing of the series terminals.

11. Test terminal block in accordance with claim 8, wherein the fastening elements each have at least one polarizing element and the mounting terminals each have a corresponding polarizing groove into which the polarizing elements is insertable.

12. Test terminal block in accordance with of claim 8, wherein the contact plugs of the individual test plugs have different lengths.

13. Test terminal block in accordance with claim 8, wherein the fastening elements each have a guide crosspiece and each of the mounting terminals have a corresponding guide groove into which the respective guide piece is inserted.

14. Test terminal block in accordance with claim 13, wherein the guide pieces of the fastening elements are longer than the contact plugs of the test plugs.

15. Test terminal block in accordance with claim 8, wherein the fastening elements are connected to one another via a grip piece, the fastening elements having a greater height than the test plugs and the grip piece being located on a top end of the fastening elements so that the grip piece spans the test plugs which are located between the two fastening elements.

16. Test terminal block in accordance with claim 15, wherein the height of the fastening elements is at least twice as great as the height of the test plug.

* * * * *